United States Patent [19]

Tsutsui et al.

[11] Patent Number: 5,594,260
[45] Date of Patent: Jan. 14, 1997

[54] PHOTOELECTRIC CONVERTER WITH PHOTOELECTRIC CONVERSION DEVICES MOUNTED SEPARATELY FROM WIRING BOARDS

[75] Inventors: Tsuyoshi Tsutsui; Munekazu Tsujikawa, both of Kyoto, Japan

[73] Assignee: Rohm Co., Ltd., Japan

[21] Appl. No.: 251,788

[22] Filed: May 31, 1994

[30]  Foreign Application Priority Data

Sep. 3, 1993 [JP] Japan .................................. 5-219976
Sep. 16, 1993 [JP] Japan .................................. 5-230025

[51] Int. Cl.⁶ ........................................................ H01L 33/00
[52] U.S. Cl. ............................... 257/80; 257/81; 257/88; 257/99; 257/443

[58] Field of Search ............................... 257/80, 81, 82, 257/83, 88, 443, 99; 361/805, 806, 807

[56]  References Cited

FOREIGN PATENT DOCUMENTS

| 61-160982 | 7/1986 | Japan | 257/88 |
| 2-127442 | 10/1990 | Japan | 257/88 |
| 5-121786 | 5/1993 | Japan | 257/88 |

*Primary Examiner*—Minhloan Tran
*Attorney, Agent, or Firm*—Brumbaugh, Graves, Donohue & Raymond

[57]  ABSTRACT

An array of printed wiring boards and a linear array of photoelectric conversion devices are arranged on one support board. The printed wiring board array is separated from the photoelectric conversion device array.

10 Claims, 5 Drawing Sheets

PHOTOELECTRIC CONVERTER WITH PHOTOELECTRIC CONVERSION DEVICES MOUNTED SEPARATELY FROM WIRING BOARDS

BACKGROUND OF THE INVENTION

The present invention relates to a photoelectric converter, such as an LED head or image sensor, and more particularly to a photoelectric converter which requires a plurality of printed wiring boards in a light emitting section of an LED head or in a light receiving section of an image sensor and comprises a linear array of photoelectric conversion devices such as LED chips or photodiodes at uniform intervals or spacing.

A light emitting section of a conventional LED head comprises a linear array of LED chips 12 on a printed wiring board 11 as shown in FIG. 1 and a plurality of LED chip drive ICs (not shown) along the LED chip array. A light receiving section of an image sensor comprises a linear array of sensor chips such as photodiode chips at even pitches on a printed wiring board (not shown) like the LED chips 12 of the LED head.

To enlarge a photoelectric converter comprising the light emitting section of the LED head, the light receiving section of the image sensor, etc., if the printed wiring board is made a single longer board, productivity lowers; even if the printed wiring board is made longer, an appropriate circuit wiring pattern must be formed for each length of the printed wiring boards formed to have desired lengths, that is, different kinds of circuit wiring patterns are required, thus it becomes difficult to standardize them, increasing costs drastically. Therefore, previously, for example, the LED head was made longer by butting together the printed wiring boards 11 with LED chips 12 and 12' arranged as shown in FIG. 2. At the time, to prevent uneven print from occurring in the butted part, each LED chip 12' on the butt end of each printed wiring board 11 was mounted so as to project from the end of the printed wiring board 11 and the LED chips 12 and 12' were arranged at equal intervals as much as possible for making the intervals of light emitting points equal pitches.

To provide a longer LED head, for example, as described in Japanese Utility Model Unexamined Publication No. Hei 2-127442, a method is proposed wherein a plurality of printed wiring boards are butted together without any gap and an LED chip 12 is disposed across the butted part, as shown in FIG. 3, for placing light emitting points at equal pitches.

However, to project LED chips from the ends of the printed wiring boards and arrange light emitting points at uniform pitches as shown in FIG. 2, alignment on the order of tens of μm must be made, thus it is hard to work and takes a long time and additional jigs and accessories for aligning the light emitting points are further required. If the printed wiring board on which LED chips are mounted expands or contracts due to a temperature change (temperature cycle) at operation or in an operating environment, the distance between the LED chips at the butted part on the ends of the printed wiring boards changes and the pitch between the light emitting points becomes uneven, causing uneven print, etc., to occur, thereby lowering product reliability.

Further, when the printed wiring boards are butted together without any gap and an LED chip is disposed across the butted part as shown in FIG. 3, since LED chips are mounted on the printed wiring board, expansion or contraction of the printed wiring board due to a temperature cycle causes the spaces between the LED chip mounted across the butted part and its adjacent LED chips to change. Further, if the respective printed wiring boards contain a thickness error and the adjacent printed wiring boards differ from each other in thickness, the LED chips arranged for each of the printed wiring boards differ in height and emitted light is placed out of focus. Also, the LED chip mounted across the butted part inclines due to a step difference occurring at the butted part, placing emitted light out of focus. Further, the LED chip may be broken.

SUMMARY OF THE INVENTION

It is therefore an object of the present invention to provide a photoelectric converter such as a high-reliability, long-sized LED head or image sensor, wherein even if a plurality of printed wiring boards are used, photoelectric conversion devices such as LED chips or photodiodes chips are not affected by expansion or contraction of the printed wiring boards because of a temperature cycle or thickness tolerance of the printed wiring boards.

To the end, according to the present invention, there is provided a photoelectric converter comprising an array of printed wiring boards and a linear array of photoelectric conversion devices arranged on one support board, the printed wiring board array being separated from the photoelectric conversion device array.

Thus, the photoelectric conversion devices are arranged as a linear array on one support board independently of the array of the printed wiring boards. Therefore, the photoelectric conversion devices are not affected by the thickness difference between the adjacent printed wiring boards, etc., and can be easily located at equal intervals. Moreover, the support board on which the photoelectric conversion devices are mounted has no butted parts, thus the photoelectric conversion devices can always be spaced from each other at equal pitches.

Since the photoelectric conversion device array is separated from the printed wiring board array, it is not affected by thermal expansion or contraction of the printed wiring boards, and even if each of the printed wiring boards contains a thickness error, there is no problem.

DETAILED DESCRIPTION OF THE PREFERRED EMBODIMENTS

Referring now to the accompanying drawings, preferred embodiments of the present invention will be described.

Figure 1:
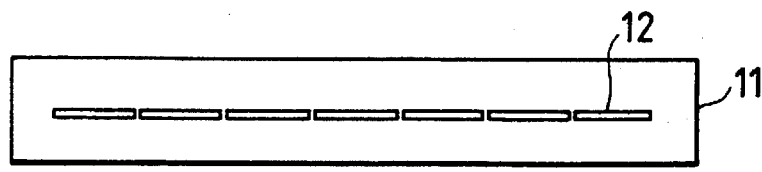
FIG. 1 is a schematic top view showing a conventional small-sized LED head.
Figure 2:
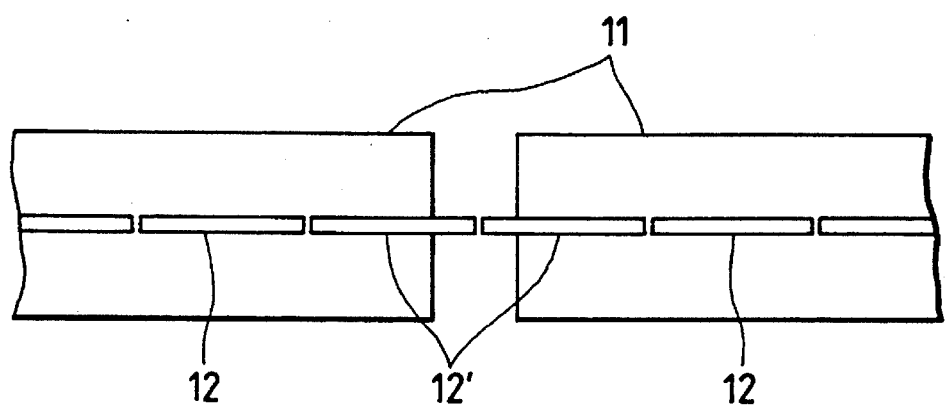
FIG. 2 is a schematic top view showing a conventional large-sized LED head.
Figure 3:
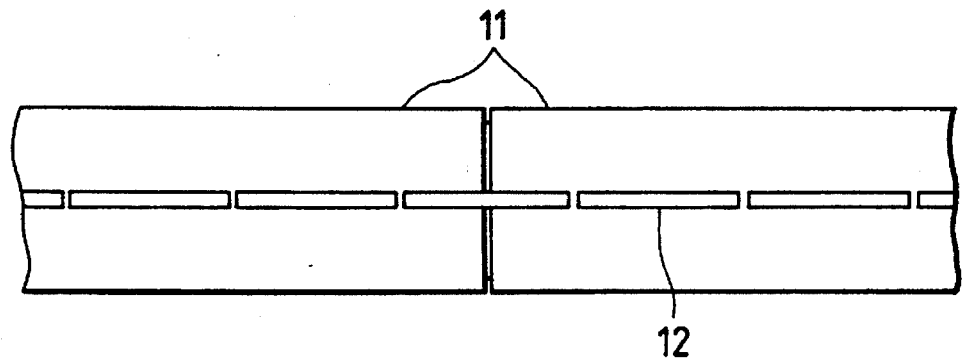
FIG. 3 is a schematic top view showing another example of a conventional large-sized LED head.
Figure 4:
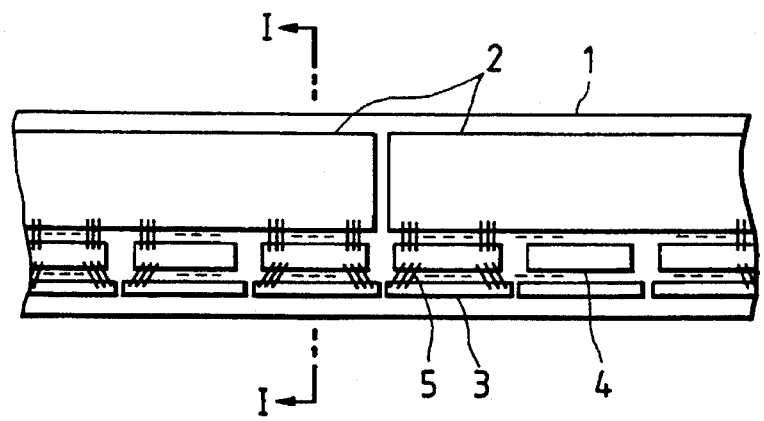
FIG. 4 is a top view showing an LED head according to a first embodiment of the invention.
Figure 5:
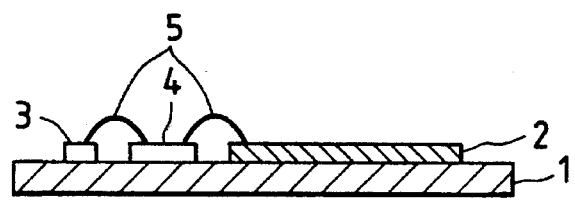
FIG. 5 is a sectional view taken on line I—I of FIG. 4.

FIGS. 4 and 5 show a first embodiment of an LED head to which the present invention is applied. The LED head according to the first embodiment comprises a long support board 1, such as a resin or metal support board, having desired length, and an array of elongated printed wiring boards 2, such as ceramic or glass-epoxy resin wiring boards, mounted on the long support board 1 along the length thereof, and a linear array of LED chips 3 which are die-bonded at substantially equal intervals and are electrically connected to the support board 1 and grounded, the linear array of the LED chips 3 being located in parallel to and separated from the array of the printed wiring boards 2. Of course, when the LED chips 3 are die-bonded, a conductive film for grounding is formed on the support board 1 if the support board 1 is an insulation board made of resin, etc. Drive ICs 4 for the LED chips 3, corresponding to the LED chips 3, are disposed on the support board 1 between the printed wiring board 2 array and the LED chip 3 array. The LED chips 3 and the drive ICs 4 and circuit wirings disposed on the printed wiring boards 2 are electrically connected by wire bonding using metal fine wires 5 such as gold wires. The bottom of the drive IC 4 (bonding face) is insulated for protection as required.

In the first embodiment, preferably the materials of which the support board 1 and the printed wiring boards 2 are made, have near coefficients of thermal expansion, thereby diminishing warping of the support board 1 and debonding and slip of the printed wiring boards 2 caused by thermal expansion or contraction of the support board 1 and the printed wiring boards 2.

When the thickness of the printed wiring board 2 is substantially made equal to the height of the LED chip 3 and the drive IC 4, the bonding pad height can be leveled when electric connection is made by wire bonding so that an advantage can be obtained.

Figure 6:
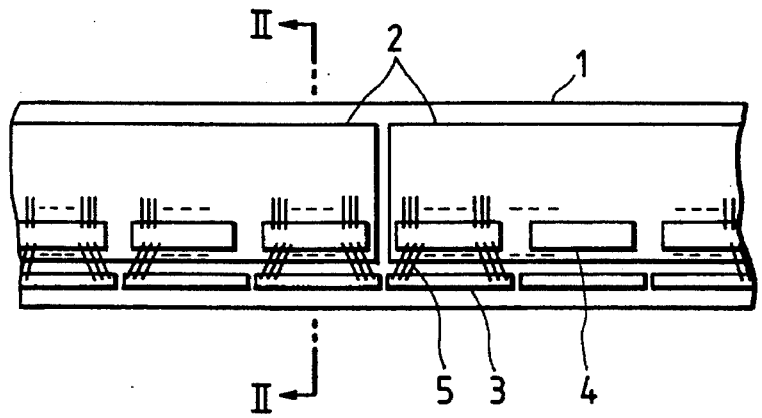
FIG. 6 is a top view showing an LED head according to a second embodiment of the invention.
Figure 7:
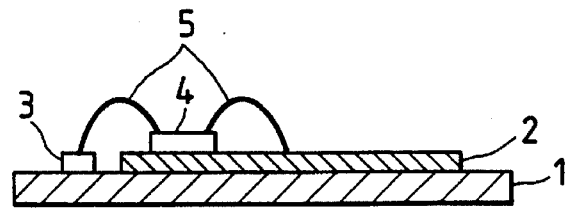
FIG. 7 is a sectional view taken on line II—II of FIG. 6.

Although the drive ICs 4 are mounted on the support board 1 in the first embodiment, they may be disposed on the printed wiring boards 2 as in a second embodiment shown in FIGS. 6 and 7, in which case the support board 1 may be made of any material and the bottom of the drive IC 4 need not be insulated for protection.

Figure 8:
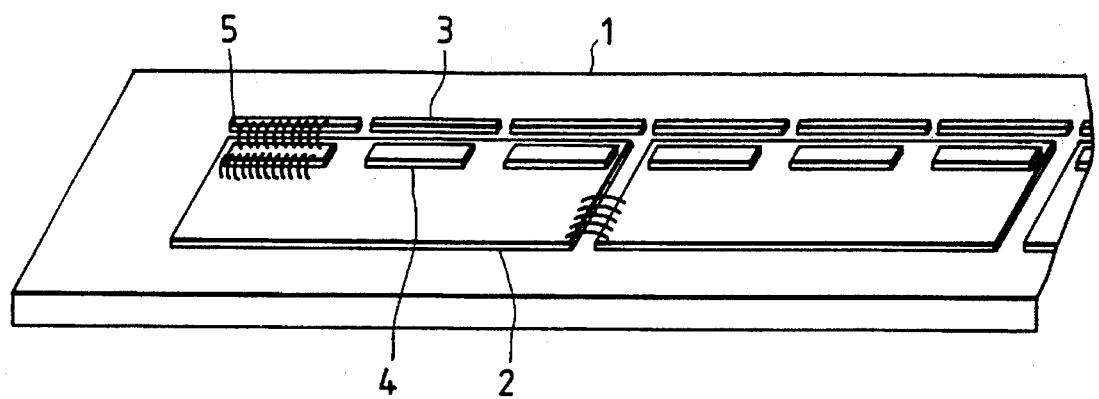
FIG. 8 is a top view showing an LED head according to a third embodiment of the invention.
Figure 9:
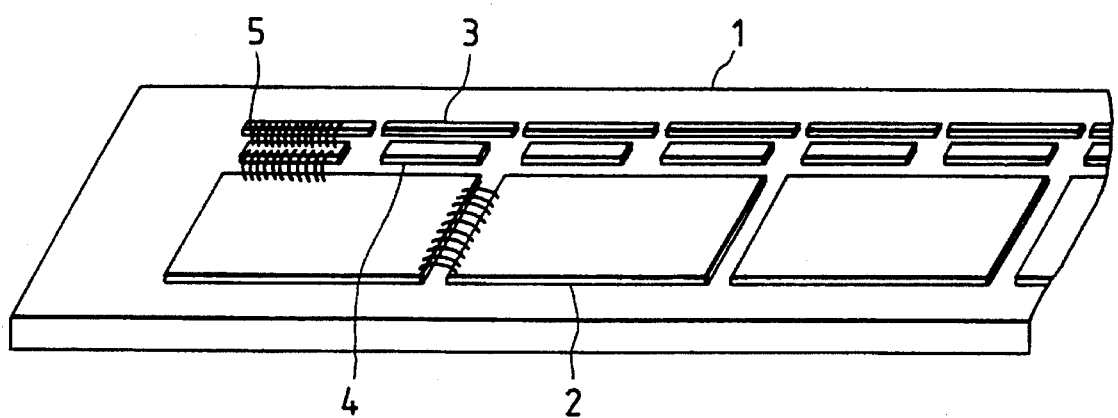
FIG. 9 is a top view showing an LED head according to a fourth embodiment of the invention.

Further, as in third and fourth embodiments shown in FIGS. 8 and 9, by moreover dividing the printed wiring boards 2 in the first and second embodiments, even if the printed wiring boards 2 expand or contract due to heat, the expansion or contraction width is distributed among the respective printed wiring boards 2. Thus, the problem caused by thermal expansion or contraction can be more relieved and reliability for temperature cycles can be more improved. Also, as the printed wiring boards 2 are miniaturized, they can be automatically mounted on the support board 1 for improvement in mounting accuracy and productivity.

Figure 10:
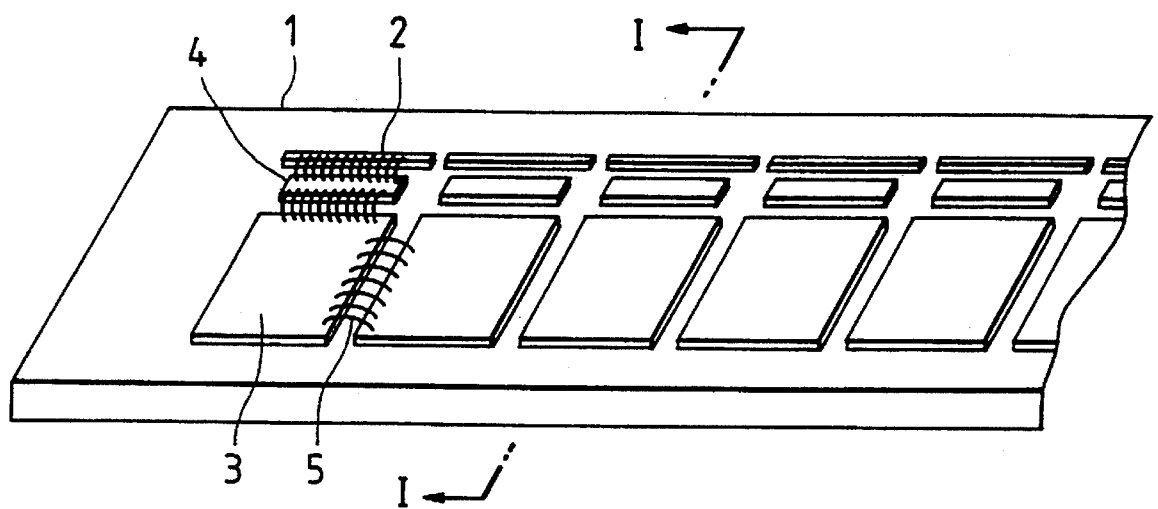
FIG. 10 is a top view showing an LED head according to a fifth embodiment of the invention.
Figure 11:
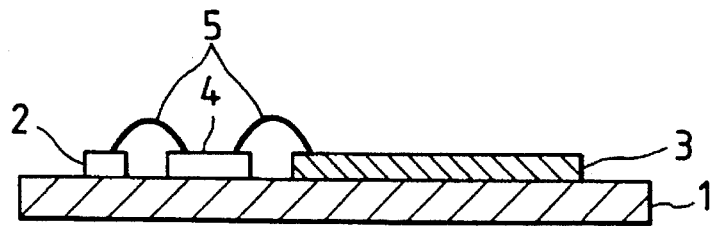
FIG. 11 is a sectional view taken on line I—I of FIG. 10.

FIGS. 10 and 11 show a fifth embodiment of an LED head to which the present invention is applied. The LED head according to this embodiment comprises a long support board 1, such as a resin or metal support board, having a desired length, a linear array of LED chips 2 which are die-bonded at substantially equal intervals with an adsorption collet or holder in automatic mounting on the long support board 1 along the length thereof and are electrically connected to the support board 1 and grounded, and an array of printed wiring boards 3, such as ceramic or glass-epoxy resin wiring boards, which are mounted at given intervals with adsorption collet or holder in automatic mounting in parallel to and separately from the array of the LED chips 2 with the width of each printed wiring board 3 (for example, about 7 mm) narrower than that of each LED chip 2 in the array direction (for example, about 8 mm), the printed wiring boards 3 being opposite to the LED chips 2 on a one-to-one basis. The printed wiring boards 3 can be mounted in the same process as the LED chips 2 are mounted. Of course, when the LED chips 2 are die-bonded, a conductive film for grounding is formed on the support board 1 if the support board 1 is an insulation board made of resin, etc.

Drive ICs 4 for the LED chips 2, corresponding to the LED chips 2, are disposed on the support board 1 between the LED chip 2 array and the printed wiring board 3 array by automatic mounting.

The LED chips 2, the drive ICs 4 and circuit wirings disposed on the printed wiring boards 3, and as required, the circuit wirings on the printed wiring boards 3 are electrically connected by wire bonding using metal fine wires 5 such as gold wires. The bottom of the drive IC 4 (bonding face) is insulated for protection as required.

Similarly to the previous embodiments, in the fifth embodiment, preferably the materials of which the support board 1 and the printed wiring boards 3 are made, have near coefficients of thermal expansion, thereby diminishing warping of the support board 1 and debonding and slip of the printed wiring boards 3 caused by thermal expansion or contraction of the support board 1 and the printed wiring boards 3, and furthermore improving reliability for temperature cycles.

Also, when the thickness of the printed wiring board 3 is substantially made equal to the height of the LED chip 2 and the drive IC 4, the bonding pad height can be leveled when electric connection is made by wire bonding so that an advantage can be obtained.

Figure 12:
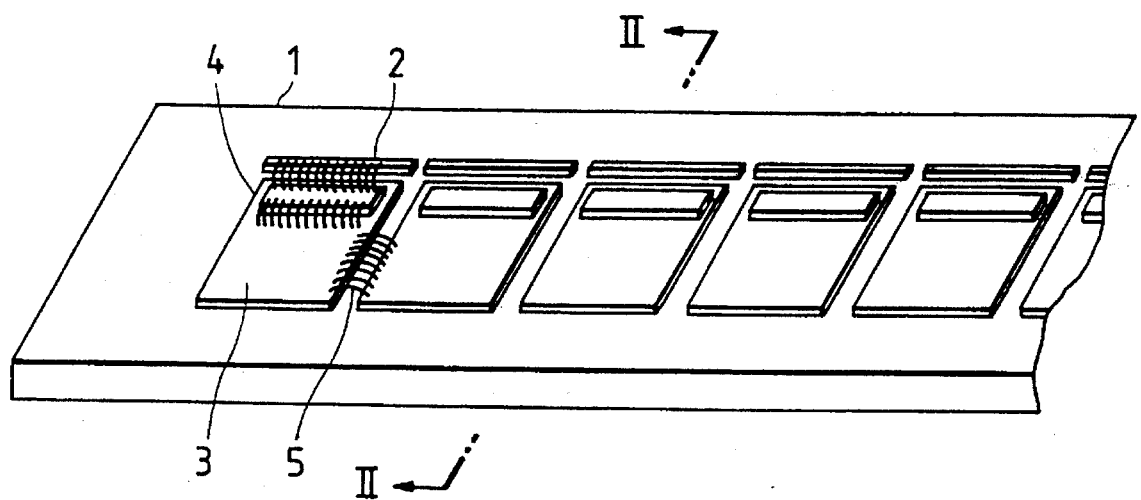
FIG. 12 is a top view showing an LED head according to a sixth embodiment of the invention.
Figure 13:
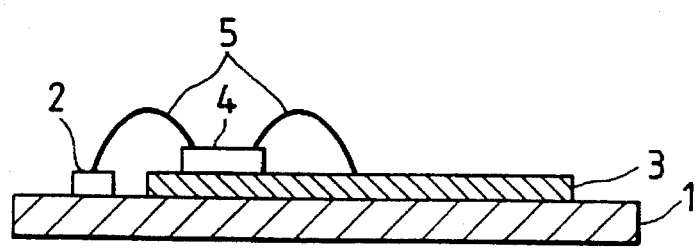
FIG. 13 is a sectional view taken on line II—II of FIG. 12.

Although the drive ICs 4 are mounted on the support board 1 in the fifth embodiment, they may be disposed on the printed wiring boards 3 as shown in FIGS. 12 and 13, in which case the support board 1 may be made of any material and the bottom of the drive IC 4 need not be insulated for protection.

In the description presented before, the LED head is taken as an example, but if light receiving devices (sensor chips) such as photodiode chips are used in place of the LED chips 2 in the embodiments, the present invention can also be applied to a light receiving section of an image sensor. Of course, when sensor chips are used, the drive ICs 4 are not required.

According to the present invention, the photoelectric conversion devices are disposed as a linear array on one board (support board), so that the board on which the photoelectric conversion devices are mounted has no butted parts, and the need for cumbersome adjustment of light emitting point intervals or spacing at the butted parts is eliminated, thereby drastically reducing the manufacturing process time. Further, since the photoelectric conversion devices are arranged on a single board, linearity of the array of the photoelectric conversion devices can be more improved and dimension accuracy of spacing the photoelectric conversion devices can also be improved.

Moreover, since a plurality of separate printed wiring boards are used, when photoelectric converters of different lengths are manufactured, if the number of printed wiring boards is changed, circuit wiring need not be formed for each length. Thus, several kinds of printed wiring boards which differ in length need only to be provided so that standardization of the printed wiring boards can be achieved.

Further, when the printed wiring boards are disposed so that they are opposite to the photoelectric conversion devices on a one-to-one basis, the printed wiring boards can be mounted on the support board, for example, with an adsorption collet, holder, etc., in automatic mounting Also, when separate printed wiring boards are disposed corresponding to the respective photoelectric conversion devices, even if the printed wiring boards expand or contract due to a temperature cycle, the expansion or contraction width is distributed substantially uniformly among the printed wiring boards. Thus, even if stress of the expansion or contraction is given to the thin metal wires connecting the printed wiring boards and the photoelectric conversion devices, occurrences of connection failure, broken lines, etc., can be extremely decreased and reliability for temperature cycles can also be improved.

What is claimed is:

1. A photoelectric converter, comprising:

a single support board;

a plurality of printed wiring boards arranged in a line on said single support board; and a plurality of photoelectric conversion devices arranged in a linear line spaced from the line of printed wiring boards on said single support board, said printed wiring boards being separated from said photoelectric conversion device and each of the printed wiring boards being electrically joined to only a selected portion of the plurality of photoelectric conversion devices.

2. The photoelectric converter as claimed in claim 1, wherein said printed wiring boards are opposite to said photoelectric conversion devices on a one-to-one basis.

3. The photoelectric converter as claimed in claim 2, wherein said photoelectric conversion devices are LED chips.

4. The photoelectric converter as claimed in claim 2, wherein said photoelectric conversion devices are photodiode chips.

5. The photoelectric converter as claimed in claim 2, further comprising drive ICs for said photoelectric conversion devices, said drive ICs being disposed on said single support board between said printed wiring boards and said photoelectric conversion devices.

6. The photoelectric converter as claimed in claim 2, further comprising drive ICs for said photoelectric conversion devices, said drive ICs being disposed on said printed wiring boards.

7. The photoelectric converter as claimed in claim 1, wherein said photoelectric conversion devices are LED chips.

8. The photoelectric converter as claimed in claim 1, wherein said photoelectric conversion devices are photodiode chips.

9. The photoelectric converter as claimed in claim 1, further comprising drive ICs for said photoelectric conversion devices, said drive ICs being disposed on said single support board between said printed wiring boards and said photoelectric conversion devices.

10. The photoelectric converter as claimed in claim 1, further comprising drive ICs for said photoelectric conversion devices, said drive ICs being disposed on said printed wiring boards.

* * * * *